(12) United States Patent
Le et al.

(10) Patent No.: US 7,550,055 B2
(45) Date of Patent: Jun. 23, 2009

(54) ELASTOMER BONDING OF LARGE AREA SPUTTERING TARGET

(75) Inventors: Hienminh H. Le, San Jose, CA (US); Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 604 days.

(21) Appl. No.: 11/224,221

(22) Filed: Sep. 12, 2005

(65) Prior Publication Data

US 2006/0266643 A1 Nov. 30, 2006

Related U.S. Application Data

(60) Provisional application No. 60/686,095, filed on May 31, 2005.

(51) Int. Cl.
*B32B 15/00* (2006.01)
(52) U.S. Cl. .................. 156/276; 156/381; 156/382; 156/385; 156/386; 156/583.1; 204/298.12; 204/298.14
(58) Field of Classification Search .................. None
See application file for complete search history.

(56) References Cited

U.S. PATENT DOCUMENTS

| 4,259,403 A | 3/1981 | Tomlinson |
| 5,250,467 A | 10/1993 | Somekh et al. |
| 5,356,835 A | 10/1994 | Somekh et al. |
| 5,507,897 A | 4/1996 | Campet et al. |
| 5,595,337 A | 1/1997 | Demaray et al. |
| 5,736,021 A | 4/1998 | Ding et al. |
| 5,799,860 A | 9/1998 | Demaray et al. |
| 5,877,087 A | 3/1999 | Mosely et al. |
| 5,879,523 A | 3/1999 | Wang et al. |
| 5,903,428 A | 5/1999 | Grimard et al. |

(Continued)

FOREIGN PATENT DOCUMENTS

CN 1873049 12/2006

(Continued)

OTHER PUBLICATIONS

Extended European Search Report dated Jul. 31, 2007 for European Application No. 05023286.7.

(Continued)

*Primary Examiner*—Philip C Tucker
*Assistant Examiner*—Kimberly K McClelland
(74) *Attorney, Agent, or Firm*—Patterson & Sheridan LLP

(57) ABSTRACT

Embodiments of the present invention generally relate to sputtering targets used in semiconductor manufacturing. In particular, the invention relates to bonding the sputtering target to a backing plate that supports the sputtering target in a deposition chamber. In one embodiment, a method of bonding at least one sputtering target tile to a backing plate comprises providing an elastomeric adhesive layer between the at least one sputtering target tile and the backing plate, and providing at least one metal mesh within the elastomeric adhesive layer, wherein at least a portion of the at least one metal mesh contacts both the at least one sputtering target tile and the backing plate, and the at least a portion of the at least one metal mesh is made of metal wire with diameter greater than 0.5 mm.

29 Claims, 5 Drawing Sheets

U.S. PATENT DOCUMENTS

| | | | |
|---|---|---|---|
| 5,976,327 A | 11/1999 | Tanaka et al. | |
| 5,976,334 A | 11/1999 | Fu et al. | |
| 6,001,227 A | 12/1999 | Pavate et al. | |
| 6,013,159 A | 1/2000 | Adams et al. | |
| 6,045,666 A | 4/2000 | Satitpunwaycha et al. | |
| 6,066,358 A | 5/2000 | Guo et al. | |
| 6,080,665 A | 6/2000 | Chen et al. | |
| 6,086,725 A | 7/2000 | Abburi et al. | |
| 6,110,828 A | 8/2000 | Guo et al. | |
| 6,122,921 A | 9/2000 | Brezoczky et al. | |
| 6,126,791 A | 10/2000 | Pavate et al. | |
| 6,169,030 B1 | 1/2001 | Naik et al. | |
| 6,171,455 B1 | 1/2001 | Pavate et al. | |
| 6,197,167 B1 | 3/2001 | Tanaka | |
| 6,207,026 B1 | 3/2001 | Crocker | |
| 6,207,558 B1 | 3/2001 | Singhvi et al. | |
| 6,221,221 B1 | 4/2001 | Al-Shaikh et al. | |
| 6,228,186 B1 | 5/2001 | Pavate et al. | |
| 6,297,147 B1 | 10/2001 | Yang et al. | |
| 6,340,415 B1 | 1/2002 | Raaijmakers et al. | |
| 6,352,620 B2 | 3/2002 | Yu et al. | |
| 6,355,560 B1 | 3/2002 | Mosely et al. | |
| 6,391,771 B1 | 5/2002 | Naik et al. | |
| 6,395,157 B2 | 5/2002 | Khurana et al. | |
| 6,399,479 B1 | 6/2002 | Chen et al. | |
| 6,472,867 B1 | 10/2002 | Abburi et al. | |
| 6,517,663 B1 | 2/2003 | Kelley et al. | |
| 6,521,107 B2 | 2/2003 | Abburi et al. | |
| 6,589,407 B1 | 7/2003 | Subramani et al. | |
| 6,660,135 B2 | 12/2003 | Yu et al. | |
| 6,726,776 B1 | 4/2004 | Mosely et al. | |
| 6,740,221 B2 | 5/2004 | Cheung et al. | |
| 6,743,714 B2 | 6/2004 | Mosely et al. | |
| 6,858,547 B2 | 2/2005 | Metzner et al. | |
| 7,316,763 B2 * | 1/2008 | Hosokawa et al. | 204/192.12 |
| 2006/0006058 A1 * | 1/2006 | Tepman | 204/192.12 |
| 2006/0006064 A1 * | 1/2006 | Tepman | 204/298.12 |
| 2006/0219549 A1 | 10/2006 | Mishima et al. | |
| 2006/0283703 A1 * | 12/2006 | Le et al. | 204/192.12 |
| 2006/0283705 A1 * | 12/2006 | Tanase et al. | 204/298.12 |
| 2007/0205101 A1 * | 9/2007 | Ye et al. | 204/298.12 |
| 2007/0295596 A1 * | 12/2007 | Inagawa et al. | 204/192.1 |
| 2008/0000770 A1 * | 1/2008 | White | 204/298.12 |

FOREIGN PATENT DOCUMENTS

| | | | |
|---|---|---|---|
| DE | 195 27 476 | * | 1/1997 |
| EP | 0 461 966 | | 12/1991 |
| EP | 1 728 892 | | 12/2006 |
| EP | 1 811 057 | | 7/2007 |
| GB | 2 053 763 | | 2/1981 |
| GB | 2 055 869 | | 3/1981 |
| JP | 63-317668 | * | 12/1988 |
| JP | 2-058478 | * | 2/1990 |
| JP | 2-184578 | * | 7/1990 |
| JP | 8-170170 | * | 7/1996 |
| JP | 9-003637 | * | 1/1997 |
| JP | 10 121232 | | 5/1998 |
| JP | 10-130829 | * | 5/1998 |
| JP | 11-131225 | * | 5/1999 |
| JP | 2000 160334 | | 6/2000 |
| JP | 2004-217990 | * | 8/2004 |
| TW | 2005002416 | | 1/2005 |
| TW | 200516162 | | 5/2005 |
| TW | 262954 B | | 10/2006 |
| TW | 263691 B | | 10/2006 |
| TW | 265203 B | | 11/2006 |
| TW | 266809 B | | 11/2006 |
| WO | 2005111261 | | 11/2005 |

OTHER PUBLICATIONS

Search Report for Taiwan Invention Patent Application No. 094136405 dated Jun. 24, 2007.

"Bonding Services", *TCB Bonding Services*, TCB Thermal Conductive Bonding, Inc., www.tcbonding.com/bonding.htm, 2004.

"Company", *TCB Company*, TCB Thermal Conductive Bonding, Inc., www.tcbonding.com/company.htm, 2004.

Stimson, Brad and Ritchie, Alan "Enhanced PVD vacuum pumping an chamber design increases system availability," Critical Components & Sub Systems, Semiconductor Fabtech—24$^{TH}$ Edition, Sep. 20, 2005, pp. 155-157.

U.S. Appl. No. 11/167,520, filed Jun. 27, 2005.

"What is Sputtering? and PVD Thin Films", *TCB Sputtering*, TCB Thermal Conductive Bonding, Inc., www.tcbonding.com/sputtering.htm, 2004.

* cited by examiner

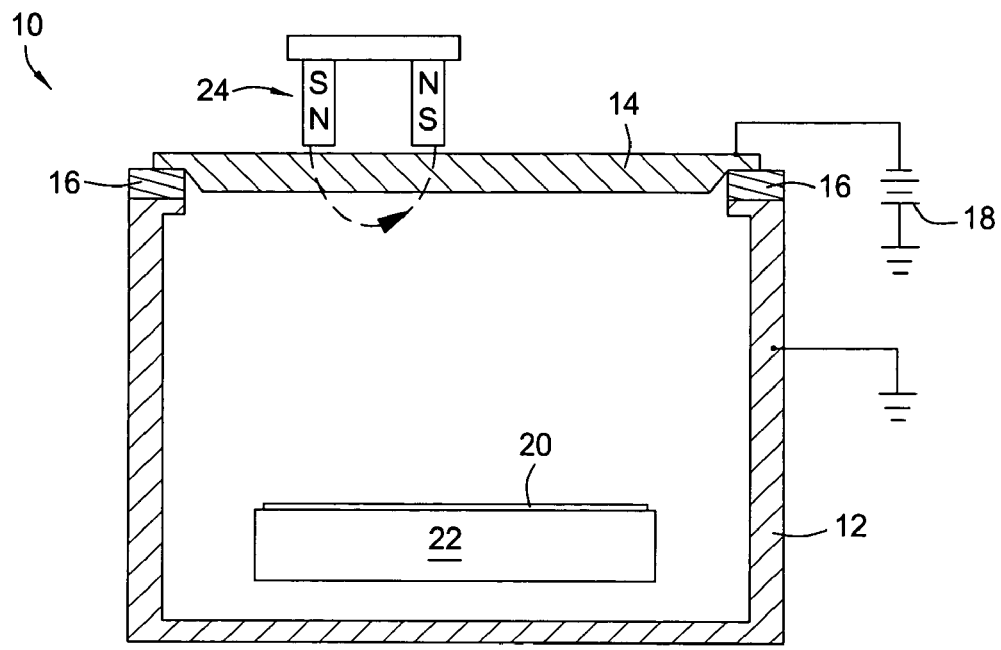
FIG. 1
(PRIOR ART)
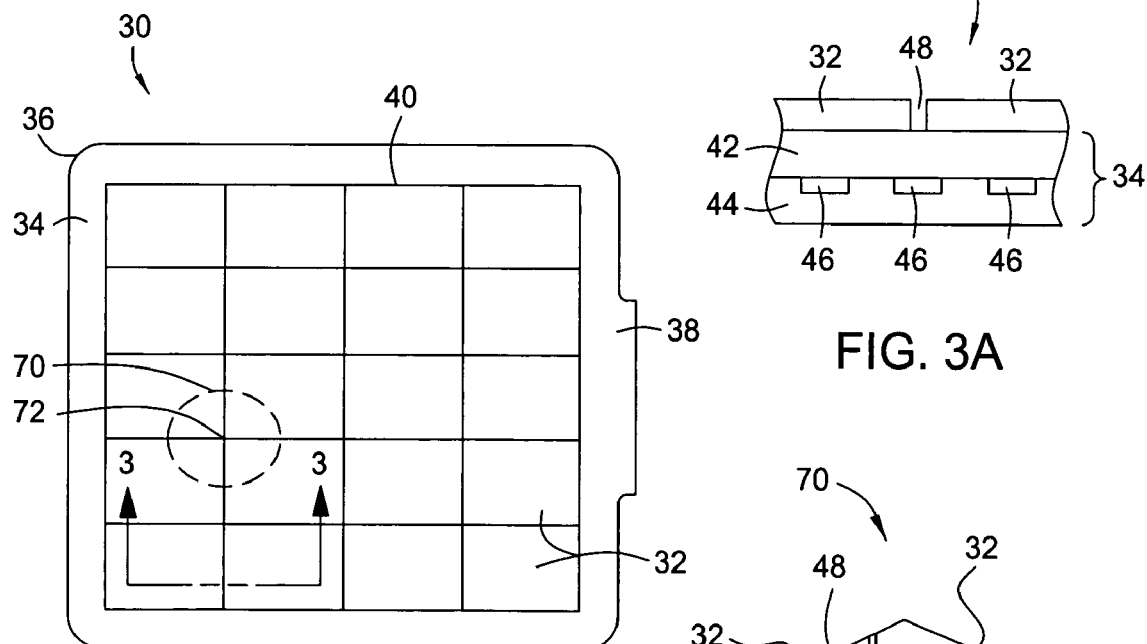
FIG. 2
FIG. 3A
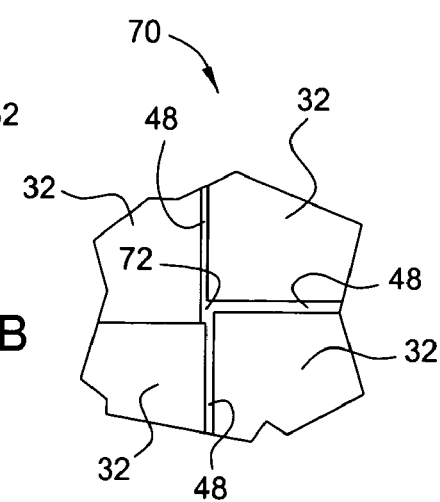
FIG. 3B

ELASTOMER BONDING OF LARGE AREA SPUTTERING TARGET

CROSS-REFERENCE TO RELATED APPLICATIONS

This application claims benefit of U.S. provisional patent application Ser. No. 60/686,095, filed May 31, 2005, which is herein incorporated by reference.

BACKGROUND OF THE INVENTION

1. Field of the Invention

Embodiments of the present invention generally relate to sputtering targets used in electronic device manufacturing. In particular, the invention relates to bonding the sputtering target to a backing plate that supports the sputtering target in a deposition chamber.

2. Description of the Related Art

Physical vapor deposition (PVD) is one of the most commonly used processes in fabrication of electronic devices. PVD is a plasma process performed in a vacuum chamber where a negatively biased target is exposed to a plasma of an inert gas having relatively heavy atoms (e.g., argon) or a gas mixture comprising such inert gas. Bombardment (or sputtering) of the target by ions of the inert gas results in ejection of atoms of the target material. The ejected atoms accumulate as a deposited film on a substrate placed on a substrate pedestal disposed underneath the target within the chamber. Flat panel display sputtering is principally distinguished from the long developed technology of wafer sputtering by the large size of the substrates and their rectangular shape.

FIG. 1 (prior art) shows a typical DC magnetron PVD reactor 10, which includes an electrically grounded vacuum chamber 12 to which a target 14 is vacuum sealed through an electrical isolator 16. A DC power supply 18 negatively biases the target 14 with respect to the chamber 12 to excite an argon sputter working gas into a plasma. However, it is noted that RF sputtering is also known. The positively charged argon ions are attracted to the biased target 14 and sputter material from the target 14 onto a substrate 20 supported on a pedestal in opposition to the target 14. A magnetron 24 positioned in back of the target projects a magnetic field parallel to the front face of the target 14 to trap electrons, thereby increasing the density of the plasma and increasing the sputtering rate. In modern sputter reactors, the magnetron may be smaller and be scanned about the back of the target 14. Even a large magnetron may be scanned in order to improve the uniformity of erosion and deposition. Aluminum, titanium, and copper targets are typically formed of a sputtering layer of the material to be sputtered coated onto or bonded to a target backing plate of less expensive and more readily machineable material.

Sputter reactors were largely developed for sputtering onto substantially circular silicon wafers. Over the years, the size of silicon wafers has increased from 50 mm diameters to 300 mm. Sputtering targets need to be somewhat larger than the size of the wafers to provide more uniform deposition across the wafers. Typically, wafer sputter targets are formed of a single circular member for some materials such as aluminum and copper or a single continuous sputter layer formed on a backing plate for more difficult materials.

In the early 1990's, sputter reactors were developed for thin film transistor (TFT) circuits formed on glass panels to be used for large displays, such as liquid crystal displays (LCDs) for use as computer monitors or television screens. The technology was later applied to other types of displays, such as plasma displays, and solar panels, and on other panel compositions, such as plastic and polymer. Some of the early reactors were designed for panels having a size of about 400 mm×600 mm. Because of the increasing sizes of flat panel displays being produced and the economy of scale realized when multiple displays are fabricated on a single glass panel and thereafter diced, the size of the panels has been continually increasing. Flat panel fabrication equipment is commercially available for sputtering onto panels having a minimum size of 1.8 meter and equipment is being contemplated for panels having sizes of 2 m×2 m and even larger.

Due to the increasing sizes of panels, conventional way of bonding the sputtering targets to the backing plates by indium bonding is getting very expensive as the sputtering targets get larger and larger. Therefore, there is a need for a method of bonding sputtering targets to backing plates for large area substrate processing system that is economical and robust.

SUMMARY OF THE INVENTION

Embodiments of the invention provide a method of bonding sputtering target tiles to the backing plate. Embodiments of the invention further provide a sputtering target assembly comprising an elastomeric adhesive layer between a sputtering target tile and a backing plate. In one embodiment, a method of bonding at least one sputtering target tile to a backing plate comprises providing an elastomeric adhesive layer between the at least one sputtering target tile and the backing plate, and providing at least one metal mesh within the elastomeric adhesive layer, wherein at least a portion of the at least one metal mesh contacts both the at least one sputtering target tile and the backing plate, and the at least a portion of the at least one metal mesh is made of metal wire with diameter greater than 0.5 mm.

In another embodiment, a method of bonding at least one sputtering target tile to a backing plate comprises providing at least one elastomeric adhesive layer between the at least one sputtering target tile and the backing plate, and providing at least one metal mesh within the at least one elastomeric adhesive layer, wherein at least a portion of the at least one metal mesh contacts both the at least one sputtering target tile and the backing plate and the total surface area of the openings of the at least one metal mesh is between about 40% to about 70% of the total bonding surface area of the at least one sputtering target tile.

In another embodiment, a sputtering target assembly comprises at least one sputtering target tile, a backing plate for the at least one sputtering target tile, an elastomeric adhesive layer between the at least one sputtering target tile and the backing plate, wherein the elastomeric adhesive layer bonds the at least one sputtering target and the backing plate together, and at least one metal mesh within the elastomeric adhesive layer, wherein at least a portion of the at least one metal mesh contacts both the at least one sputtering target tile and the backing plate, and the at least a portion of the at least one metal mesh is made of metal wire with diameter greater than 0.5 mm.

In yet another embodiment, a sputtering target assembly comprises at least one sputtering target tile, a backing plate for the at least one sputtering target tile, at least one elastomeric adhesive layer between the at least one sputtering target tile and the backing plate, wherein the at least one elastomeric adhesive layer bonds the at least one sputtering target and the backing plate together, and at least one metal mesh within the at least one elastomeric adhesive layer, wherein at least a portion of the at least one metal mesh contacts both the at least one sputtering target tile and the backing plate, and the total surface area of the openings of the at least one metal mesh is between about 40% to about 70% of the total bonding surface area of the at least one sputtering target tile.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 (prior art) is a schematic cross-sectional view of a conventional plasma sputter reactor.

FIG. 2 is a plan view of a rectangular target formed from a two-dimensional array of target tiles.

FIG. 3A is a cross-sectional view of a conventional configuration of target tiles bonded to a target backing including cooling channels.

FIG. 3B is a plan view of a corner area between four tiles.

DETAILED DESCRIPTION

Figure 4:
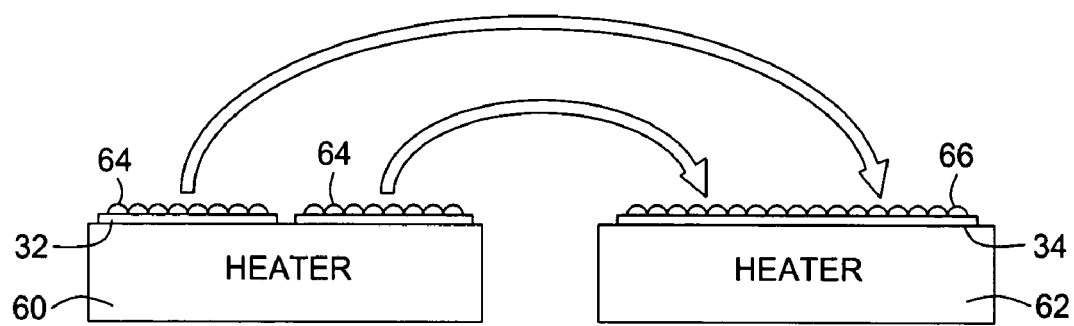
FIG. 4 (prior art) is a schematic view illustrating a conventional method of bonding target tiles to a backing plate.

For large sputtering targets, a two-dimensional tile arrangement, such as the one illustrated in FIG. 2, is sometimes necessary. Rectangular target tiles 32 are arranged in a rectangular array and bonded to a target backing plate 34. As shown in the plan view of FIG. 2, a substantially rectangular target 30 includes rectangular target tiles 32 arranged in a rectangular array and bonded to a target backing plate 34. The tile size depends on a number of factors including ease of fabricating the tiles and they may number 3×1, 3×3, 4×5 (as shown in FIG. 2), or other applicable combinations. The tiles 32 may be of substantial size, for example 750 mm×900 mm, such that a 3×3 array is required for a larger panel. The number of tiles in the tile array may be even greater if the target material is difficult to work with, such as chromium or molybdenum. The illustrated target backing plate 34 is generally rectangularly shaped to conform to the shape and size of the panel being sputter coated but its corners 36 are typically rounded to conform to the chamber body supporting it and it could include an extension 38 from the chamber body containing an electrical terminal for powering the target and pipe couplings for the cooling fluid used to cool the target 30. As illustrated in an exemplary cross section in FIG. 3A, the target backing plate 34 for flat panel sputtering is typically formed from two metal plates 42, 44, for example, of titanium welded or otherwise bonded together. One of the plates 42, 44 is formed with linear cooling channels 46 through which the cooling fluid circulates. This backing plate 34 is more complex than the usual backing plate for wafer processing since, for the very large panel size, it is desired to provide a backside vacuum chamber rather than the usual cooling bath so as to minimize the differential pressure across the very large target 30.

The tiles 32 are bonded to the backing plate 34 on its chamber side with a gap 48 possibly formed between the tiles 32. Typically, the tiles 32 have a parallelopiped shape with perpendicular corners with the possible exception of beveled edges at the periphery of the tile array. The gap 48 is intended to satisfy fabricational variations and thermal expansion of tiles and may be between 0 and 0.5 mm. Neighboring tiles 32 may directly abut but should not force each other. On the other hand, the width of the gap 48 should be no more than the plasma dark space, which generally corresponds to the plasma sheath thickness and is generally slightly greater than about 0.5 mm for the usual pressures of argon working gas. Plasmas cannot form in spaces having minimum distances of less than the plasma dark space. In addition, as illustrated for a corner area 70 between four tiles 32 in the plan view of FIG. 3B, the four tiles 32 arranged in a rectangular array tend to slide along each other and be misaligned with different sizes for the inter-tile gaps 48. An interstix is meant a point or space at the interfaces between three or more tiles so that the term does not include the line between two tiles. Even a well defined interstix 72 presents the greatest gap between tiles 32. It's important to keep with greatest width of interstix 72 to be blow the plasma dark space to prevent formation of plasma in the interstix 72. As a result, the underlying titanium backing plate 34 is not sputtered while the tiles 32 are being sputtered.

Returning to FIG. 2, the tiles 32 are arranged within a rectangular outline 40 conforming approximately to the area of the target 30 desired to be sputtered or somewhat greater. The magnetron 24 of FIG. 1 is scanned within this outline 40. Shields or other means are used to prevent the un-tiled surface of the backing plate 34 from being exposed to high-density plasma and be thereby sputtered. Clearly sputtering a backing plate 34, made of material such as titanium, supporting molybdenum or other tiles is not desired. Even if the backing plate 34 is composed of the same material as the target tiles 32, sputtering of the backing plate 34 is not desired. The backing plate 34 is a complex structure and it is desired to refurbish it after one set of tiles 32 have been exhausted and to use it for a fresh set of tiles 32. Any sputtering of the backing plate 34 should be avoided.

There are several processes and bonding materials available for bonding target tiles to the backing plates. One popular process illustrated in FIG. 4 (prior art) includes an apparatus comprising two heating tables 60, 62. The tiles 32 are placed on one table 60 with their sputtering face oriented downwards. Each tile 32 is painted on its backside with an adhesive coating 64, such as indium. The heating table 60 heats the coated tiles 32 to about 200° C., far above indium's melting point of 156° C. so that indium wets to the tiles 32 and forms a uniform molten layer. Similarly, the backing plate 34 is placed on the other heating table 62 and is painted with an indium coating 66 and is heated to about 200° C. With all indium coatings 64, 66 in their molten state, the tiles 32 are removed from the first table 60, inverted, and placed on top of the backing plate 34 with the melted indium coatings 64, 66 facing each other and the sputtering faces oriented upwards. Upon cooling, the indium solidifies and bonds the tiles 32 to the backing plate 34.

A problem arises with indium bonding of target tiles to the backing plate resulting from the differential thermal expansion between the materials of the target tiles and the backing plate, such as molybdenum target bonded to Al backing plate. When the bonded assembly is cooled from bonding temperature of about 200° C. for indium to room temperature, the differential thermal expansion is likely to cause the assembly to bow. Because of the softness of solid indium, the bow can be pressed out of the bonded assembly. However, the pressing is a generally uncontrolled process and the tiles may slide relative to each other during the pressing to create undesired tile misalignment such as a gap greater than the plasma dark space, e.g. 1 mm.

In addition, such large mechanical structures are not easily manipulated to provide the desired degree of alignment, specifically, the bonded tiles being separated by no more than 0.5 mm. As a result, the widest point of the misaligned tiles 32 may become larger than the plasma dark space, e.g., 1 mm, so that the plasma may propagate towards the backing plate 34. If the gap is only slightly larger than the plasma dark space, the plasma state in the gap may be unsteady and result in intermittent arcing. Even if the arcing is confined to tile material, the arc is likely to ablate particles of the target material rather than atoms and create contaminant particles. If the plasma reaches the backing plate, it will be sputtered. Plate sputtering will introduce material contamination if the tiles and backing plate are of different materials. Furthermore, plate sputtering will make it difficult to reuse the backing plate for a refurbished target.

Figure 5:
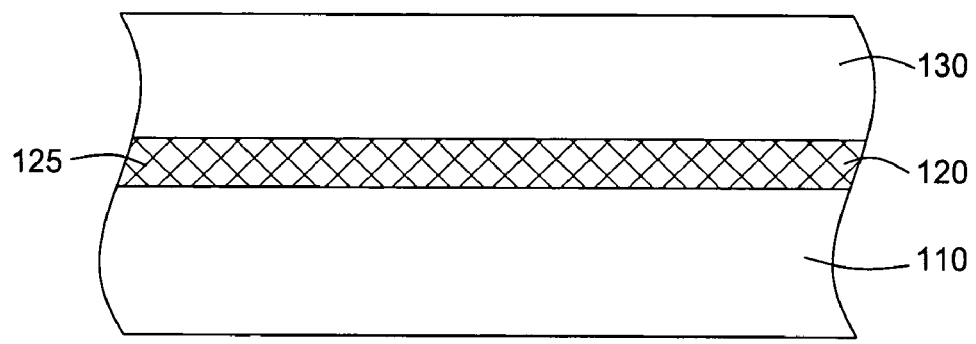
FIG. 5 is a cross-sectional view of one embodiment of the current invention of sputtering target bonded to a backing plate.

Embodiments of the invention provide a method of bonding sputtering targets or target tiles to the backing plate by using an elastomeric adhesive. The backing plate with bonded target tiles can be cured at a relatively low temperature, such as less than 100-150° C., to reduce the risk of bowing of the backing plate and the bonded target tiles. The concept of the invention can be applied to bond all sizes of sputtering targets or target tiles used for processing any type of substrates. The concept of the invention can be applied to targets greater than 750 $cm^2$, preferably to targets greater than 2000 $cm^2$, more preferably to targets greater than 15000 $cm^2$, and most preferably to targets greater than 40000 $cm^2$. FIG. 5 shows a cross section of a target (or target tile) 130 being bonded to a backing plate 110 by an elastomeric adhesive 120 with at least one metal mesh 125. The target 130 could be single piece target, target tiles welded into one piece, target tiles placed closed to one another, or welded target tiles placed close to one another. The target could be made of any type of sputtering materials that contain elements such as aluminum, copper, gold, nickel, tin, molybdenum, chromium, zinc, palladium, stainless steel, palladium, tin, indium, titanium, tungsten, neodymium and combinations thereof. Examples of films deposited by sputtering targets include: aluminum, aluminum neodymium, aluminum alloy, copper, copper alloy, gold, nickel, tin, tin alloy, molybdenum, molybdenum nitride, titanium, titanium nitride, tantalum, tantalum nitride, tungsten, chromium, zinc, zinc oxide, palladium, palladium alloys stainless steel, and indium tin oxide (ITO).

An example of target material for manufacturing of flat panel displays is molybdenum. The backing plate provides support for the sputtering target and also provides electrical connection to the power source. The backing plate 110 could be made of conductive materials, such as aluminum, copper, gold, nickel, tin, Molybdenum, chromium, zinc, palladium, stainless steel, palladium alloys, tin alloy, aluminum alloy and copper alloy. An example of backing plate material for a PVD chamber for manufacturing of flat panel displays is aluminum.

The elastomeric adhesive 120 could be any adhesives made of elastomers. The elastomers suitable to bond the target (or target tiles) and the backing plate should have low stress before and after curing process, which is performed after the target and the backing plate are pressed together with the elastomeric adhesive 120 between them. The elastomers 120 used to bond the target 130 and the backing plate 110 should also have thermal coefficient close to the target 130 and the backing plate 110. 3M of St. Paul, Minn., Dow Chemicals of Midland, Mich., and GE Consumer Electrics of Oklahoma City, Okla., offer many types of commercial elastomers for bonding between metals. An example of elastomer adhesive that can be used to bond metal to metal is AF 30/EC 1660 adhesive, available from 3M.

Figure 6:
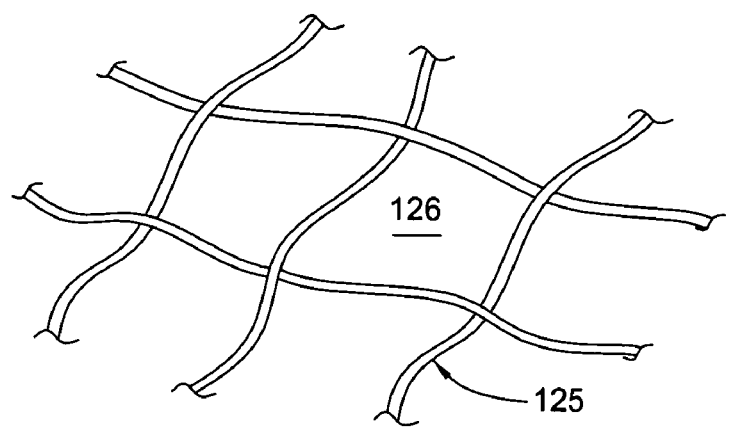
FIG. 6 is a perspective view of one embodiment of a metal mesh used in the current invention.

The metal mesh 125 could be made of any metal with good electrical and/or thermal conductivities, such as copper, aluminum, copper alloy, aluminum alloy. There could be one or more metal meshes 125 between the target 130 and the backing plate 110. The metal mesh 125 provides electrical and/or thermal conductive paths between the target 130 and the backing plate 110, which is connected to the power source. FIG. 6 shows a perspective view of one embodiment of the metal mesh 125, which is made of overlapping metal wires. The metal wires of the metal mesh 125 could be arranged in various fashions. The opening 126 in the metal mesh 125 should be large enough to let the elastomeric adhesive 120 pass through, which ensures the metal mesh has good contact with the target 130 and the backing plate 110, and prevents the elastomeric adhesive 120 from building up in certain parts between the target 130 and the backing plate 110, such as near the central region of the target. The percentage of the total surface area of openings 126 to the total bonding surface area is between about 35% to about 90%, preferably between about 40% to about 70%, and most preferably between about 55% to about 65%. If the percentage of the total surface area of the openings 126 is too low, the elastomeric adhesive cannot go through the metal mesh and prevents the metal mesh from contacting the target and/or backing plate. In addition, to ensure the metal mesh 125 to provide good contact between the target 130 and the backing plate 110 for sputtering target for PVD chamber to process large area substrates, the diameters of the metal wires used to make the metal mesh should be at least 0.5 mm, preferably greater than 0.8 mm, to provide sufficient electrical and/or thermal contact.

The elastomeric adhesive 120 is combined with the metal mesh 125 to provide good thermal conductivity between the target 130 and the backing plate 110 and ensures the target 130 can be properly cooled by the cooling medium (not shown) flowing through the backing plate 110 during sputtering process. The thermal conductivity can come from the metal mesh 125, or the elastomeric adhesive could optionally include metallic powder, such as silver powder, in the weight range between about 0% to about 80% to increase thermal conductivity. Since the sputtering process is operated under high vacuum, such as $<10^{-4}$ Torr, the elastomer between the target 130 and the backing plate 110 needs to be cured prior to usage in the process chamber to prevent out-gassing.

Figure 7:
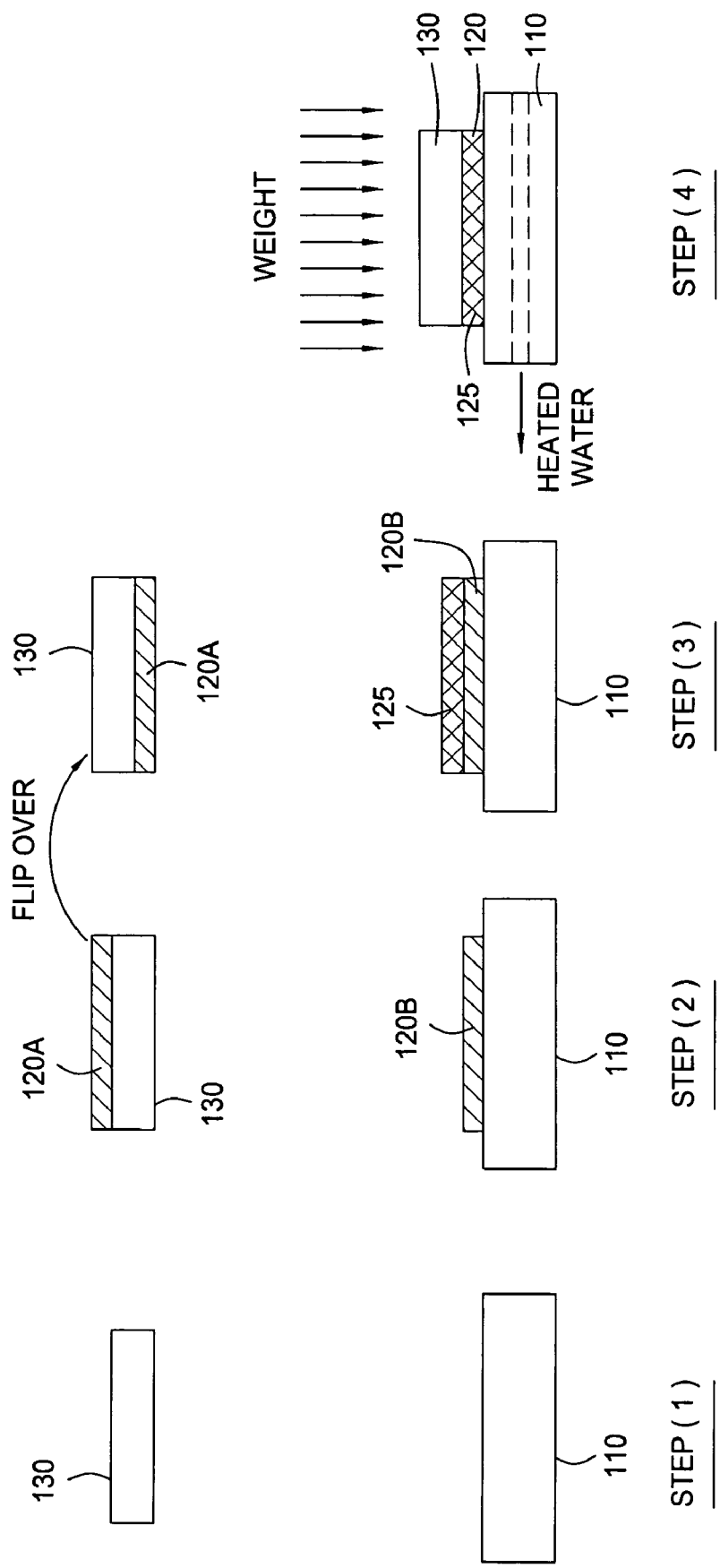
FIG. 7 shows a process flow of bonding a sputtering target to a backing plate using the metal mesh in FIG. 6.

FIG. 7 shows an embodiment of a process for bonding the target 130 and the backing plate 110 with elastomeric adhesive 120 and at least one metal mesh 125. At step (1), the target 130 and backing plate go through surface preparation sub-steps, such as sanding the edges of the target and washing the surfaces of target and backing plate that will receive the bonding material (or adhesive) and are placed on supporting structure (not shown) after the surface preparation sub-steps. The supporting structure for the target 130 could include mechanical devices that would hold or grab the target 130 and move it at a later step. The preparation sub-steps are performed to ensure that the target 130 and the backing plate 110 be prepared and secured to the supporting structures. The target 130 could be made of tiles welded together into one piece or several pieces, or could be a single un-welded piece. The target 130 could also be used for semiconductor wafer processing for >300 mm substrates. In such a case, the target could be circular.

At step (2), a layer of elastomer (or elastomeric adhesive) 120A is applied on the target 130 surface that is away from the supporting structure (or the surface that will face the backing plate). A layer of elastomer (or elastomeric adhesive) 120B is also applied on the backing plate 110 surface that is away from the supporting structure (or the surface that will face the target).

At step (3), a metal mesh 125 (or an electrical and/or thermal conductor) is placed on the elastomer layer applied on the backing plate in step (2), the target 130 with the elastomer layer 120A applied during step (2) is flipped over to allow the elastomer layer 120A to be faced downward towards the backing plate 110. The target 130 is then positioned over the backing plate 110 for bonding the target 130 and the backing plate 110 together. The metal mesh 125 should be placed in pre-determined bonding location to allow the metal mesh to be placed between the target 130 and the backing plate 110 after the target 130 and the backing plate 110 are pressed together. The target 130 can be flipped over and positioned above the backing plate 110 manually or by mechanical devices. For large targets, such as surface area greater than 20 m$^2$, manual flipping and carrying the target could be difficult due to the size and weight of the target, and mechanical devices might be needed to perform the tasks.

At step (4), the target 130 is slowly lowered to the backing plate 110 to allow the elastomer layer 120A on the target 130 to come in contact with the metal mesh 125 and elastomer layer 120B on the backing plate 110. The elastomer layer 120 is formed by pressing elastomer layer 120A and elastomer layer 120B together, and is then cured. The elastomer layer 120A on the target 130 and the elastomer layer 120B on the backing plate 110 fill the space in the metal mesh and become elastomer layer 120 and the metal mesh 125 comes in contact with the target 130 and the backing plate 110 to provide electrical and thermal contact. In one embodiment, static weight is placed on top of the sputtering target to press the sputtering target against the backing plate. In another embodiment, the sputtering target and the backing plate can be pressed together by clamps. Heated liquid, such as water, or gas, such as N$_2$, is then passed through the heating channel(s) in the backing plate 110 to cure the elastomer. The elastomer is cured to prevent outgassing during PVD processing, which operates under high vacuum, e.g. $10^{-4}$ Torr. To prevent target and/or backing plate bowing, a low temperature curing is desired. The temperature range could be between about 25° C. to about 100° C., and preferably between about 45° C. to about 70° C. and most preferably between about 45° C. to about 55° C. Curing of elastomer can be performed at room temperature, which will take a relatively long time, e.g. 1 day. Curing at higher temperature will shorten the curing time, e.g. 8 hours at 50° C. Elastomer bonding has the advantage of low processing temperature (30° C.-100° C.), compared to the processing temperature of indium bonding (about 200° C.). This low processing temperature reduces the risk of bowing of target and bonding plate after bonding process.

The time between step (2) after the elastomer has been applied on the surface of target and backing plate and step (4) when the target is pressed against the metal mesh and backing plate should not be too long to prevent the elastomer from being dried up and lose its fluidity. The duration should be kept less than 12 hours, preferably less than 6 hours, most preferably less than 2 hours.

The embodiment of process described in FIG. 7 shows that the sputtering target is positioned above the backing plate to be pressed against the backing plate. The positions of the sputtering target and the backing plate can be flipped with the sputtering target being positioned below the backing plate. The metal mesh in this case is placed on the elastomer layer on the sputtering target before the backing plate is lowered to be pressed against the metal mesh and the sputtering target.

Figure 8A:
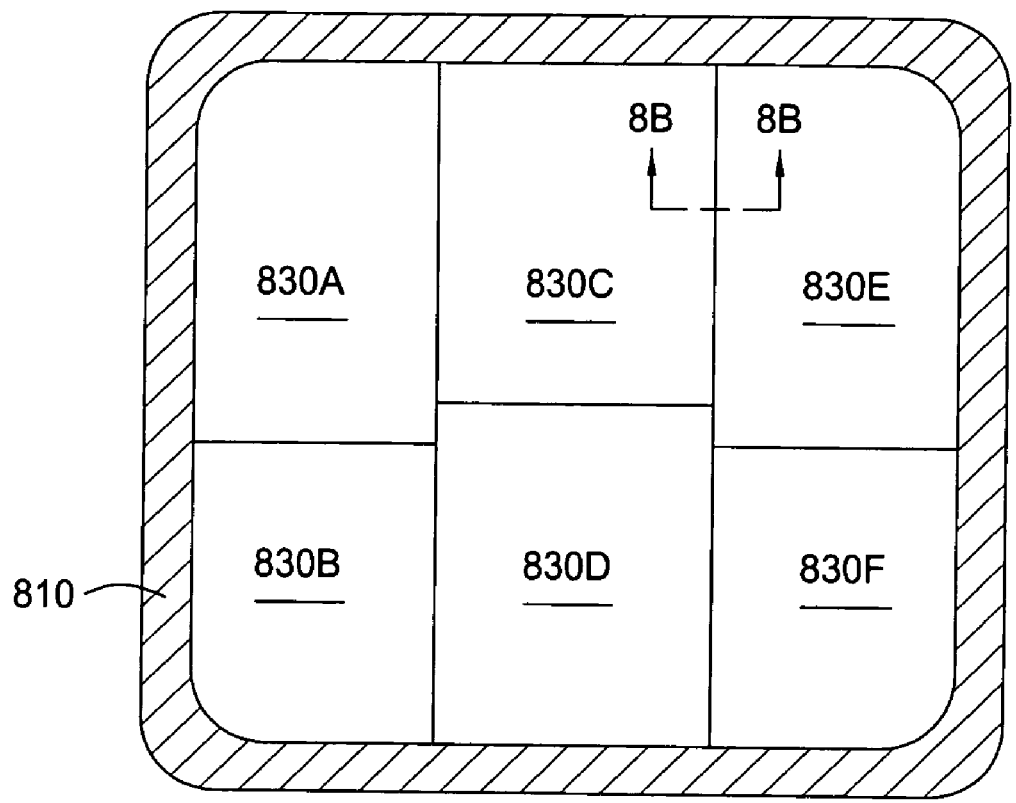
FIG. 8A shows a plan view of a rectangular target formed from a 3×2 array of target tiles.
Figure 8B:
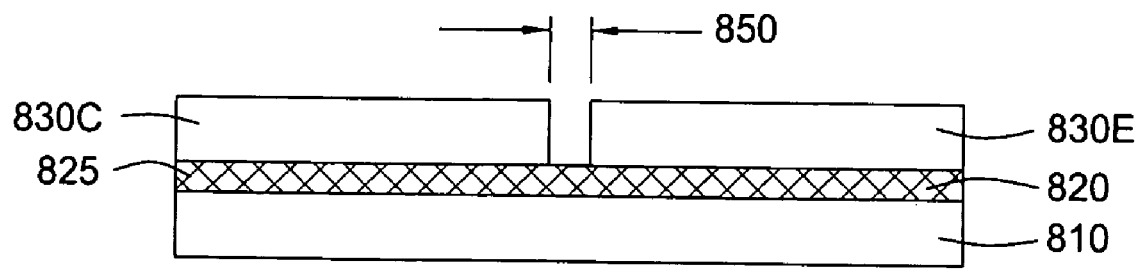
FIG. 8B shows a cross-sectional view of target tiles 830C, 830E being bonded to the backing plate of FIG. 8A.
Figure 8C:
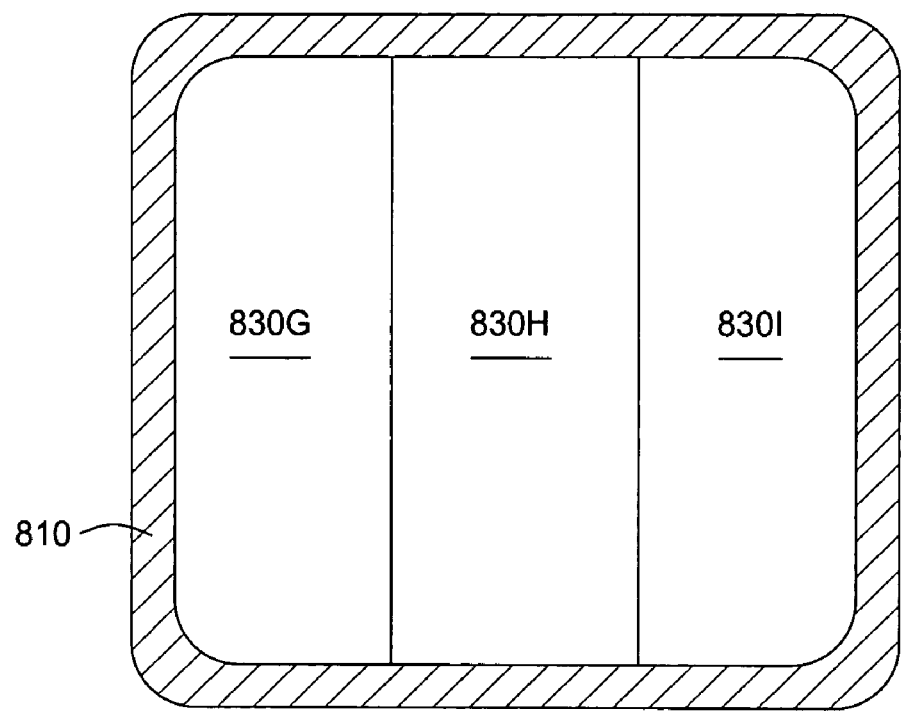
FIG. 8C shows a plan view of a rectangular target formed from a 3×1 array of target tiles.
Figure 8D:
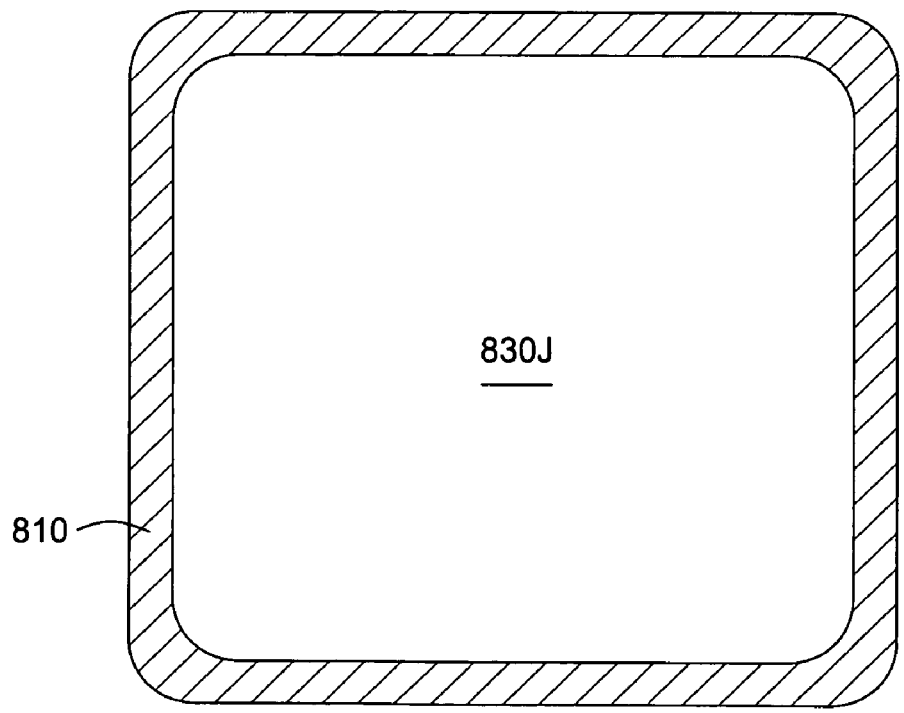
FIG. 8D shows a plan view of a rectangular target formed from an one-piece target.

The target 130 could be one piece or constructed from multiple pieces of target material. In one embodiment, multiple target tiles are bonded to the backing plate. The tiles are placed closely together and the spacing between the tiles is preferably kept below the plasma dark space, e.g. 1 mm. FIG. 8A shows a top schematic view of 6 tiles 830A, 830B, 830C, 830D, 830E, 830F being bonded to a backing plate 810. The 6 tiles 830A, 830B, 830C, 830D, 830E, and 830F could be all in one size or have different sizes. FIG. 8B shows a cross-sectional schematic view of part of tiles 830C and 830E over the backing plate 810. Between the backing plate 810 and target tiles 830C, 830E, there is a bonding layer 820 with metal mesh in the layer and the metal mesh contacts the target tiles 830C, 830E and the backing plate 810. The widest spacing 850 between the target tiles 830C, 830E should be kept below plasma dark space. FIG. 8C shows another example of multiple tiles being bonded to the backing plate. The three tiles 830G, 830H, 830I are bonded to the backing plate 810. The tiles can also be welded together into one large piece before being bonded to the backing plate. The target tiles can be bonded by laser welding, e-beam welding, or FSW before being bonded to the backing plate. FIG. 8D show a single piece target 830J being bonded to backing plate 810.

The concept of the using a metal mesh as an electrical and/or thermal conductor can also be applied to other types of bonding. For example, a metal mesh can also be placed between two conductive layers using indium as bonding materials. The concept of using metal mesh made from metal wires with diameters greater than 0.5 mm can also be used for target bonding for semiconductor wafer processing in PVD chambers. The concept of the invention can be applied to bond sputtering targets to manufacture flat panel displays, solar panels, or electronic devices.

While the foregoing is directed to embodiments of the present invention, other and further embodiments of the invention may be devised without departing from the basic scope thereof, and the scope thereof is determined by the claims that follow.

What is claimed is:

1. A method of bonding at least one sputtering target tile to a backing plate, comprising:
providing an elastomeric adhesive layer between the at least one sputtering target tile and the backing plate;
providing at least one metal mesh within the elastomeric adhesive layer, wherein at least a portion of the at least one metal mesh contacts both the at least one sputtering target tile and the backing plate, and the at least a portion of the at least one metal mesh is made of metal wire with a diameter greater than 0.5 mm; and
curing the elastomeric adhesive layer between the at least one sputtering target tile and the backing plate by passing heated water through at least one heating channel in the backing plate.

2. The method of claim 1, wherein curing the elastomeric adhesive layer is performed at a temperature less than 100° C.

3. The method of claim 2, wherein curing the elastomeric adhesive layer is performed at a temperature between 45° C. to about 70° C.

4. The method of claim 1, wherein there are at least 3 sputtering target tiles and the at least 3 sputtering target tiles are placed side by side with the widest gap between the at least 3 sputtering target tiles being less than a plasma dark space.

5. The method of claim 1, wherein the at least one sputtering target tile is made of sputtering target tiles that are welded together before bonding.

6. The method of claim 1, wherein the elastomeric adhesive layer includes metallic powder in the weight range between about 0% to about 80% to increase thermal conductivity.

7. The method of claim 1, wherein the total surface area of the openings of the metal mesh is between about 40% to about 70% of the total bonding surface area of the at least one sputtering target tile.

8. The method of claim 1, wherein the total surface area of the at least one sputtering target tile is greater than 750 $cm^2$.

9. The method of claim 1, wherein the at least one sputtering target tile is non-circular.

10. The method of claim 1, wherein the at least one sputtering target is made of a material containing an element selected from the group consisting of aluminum, copper, gold, nickel, tin, molybdenum, chromium, zinc, palladium, stainless steel, indium, titanium, tungsten, neodymium and combinations thereof.

11. The method of claim 1, wherein the backing plate is made of conductive material selected from the group consisting of aluminum, copper, gold, nickel, tin, molybdenum, chromium, zinc, palladium, stainless steel, palladium alloys, tin alloy, aluminum alloy, copper alloy, and combinations thereof.

12. A method of bonding at least one sputtering target tile to a backing plate, comprising:
providing at least one elastomeric adhesive layer between the at least one sputtering target tile and the backing plate;
providing at least one metal mesh within the at least one elastomeric adhesive layer, wherein at least a portion of the at least one metal mesh contacts both the at least one sputtering target tile and the backing plate and the total surface area of the openings of the at least one metal mesh is between about 40% to about 70% of the total bonding surface area of the at least one sputtering target tile; and,
curing the at least one elastomeric adhesive layer between the at least one sputtering target tile and the backing plate by passing heated water through at least one heating channel in the backing plate.

13. The method of claim 12, wherein the heated water is at a temperature between 45° C. to about 70° C.

14. The method of claim 12, wherein there are at least 3 sputtering target tiles and the at least 3 sputtering target tiles are placed side by side with the widest gap between the at least 3 sputtering target tiles being less than a plasma dark space.

15. The method of claim 12, wherein at least a portion of the at least one metal mesh is made of metal wire with a diameter greater than 0.5 mm.

16. The method of claim 12, wherein the at least one sputtering target tile is non-circular.

17. The method of claim 12, wherein the total surface area of the at least one sputtering target tile is greater than 750 $cm^2$.

18. A sputtering target assembly, comprising:
at least one sputtering target tile;
a backing plate for the at least one sputtering target tile, the backing plate having at least one heating channel;
an elastomeric adhesive layer between the at least one sputtering target tile and the backing plate, wherein the elastomeric adhesive layer bonds the at least one sputtering target and the backing plate together; and
at least one metal mesh within the elastomeric adhesive layer, wherein at least a portion of the at least one metal mesh contacts both the at least one sputtering target tile and the backing plate, and the at least a portion of the at least one metal mesh is made of metal wire with a diameter greater than 0.5 mm, wherein the elastomeric adhesive layer is cured by passing heated water through the at least one heating channel in the backing plate.

19. The sputtering target assembly of claim 18, wherein the total surface area of the openings in the at least one metal mesh is between about 40% to about 70% of the total sputtering surface area.

20. The sputtering target assembly of claim 18, wherein the at least one sputtering target tile is non-circular.

21. The sputtering target assembly of claim 18, wherein there are at least 3 sputtering target tiles and the at least 3 sputtering target tiles are placed side by side with the widest gap between the at least 3 sputtering target tiles being less than a plasma dark space.

22. The sputtering target assembly of claim 18, wherein the at least one of the at least one sputtering target tile is made of sputtering target tiles that are welded together before being bonded to the backing plate.

23. The sputtering target assembly of claim 18, wherein the elastomeric adhesive layer includes metallic powder in the weight range between about 0% to about 80% to increase thermal conductivity.

24. The sputtering target assembly of claim 18, wherein there is only one single sputtering target tile.

25. The sputtering target assembly of claim 18, wherein the heated water is at a temperature between 45° C. to about 70° C.

26. The sputtering target assembly of claim 18, wherein the total surface area of the at least one sputtering target tile is greater than 750 $cm^2$.

27. The sputtering target assembly of claim 18, wherein the sputtering target assembly is a PVD sputtering target assembly for manufacturing flat panel displays and solar panels.

28. A sputtering target assembly, comprising:
at least one sputtering target tile;
a backing plate for the at least one sputtering target tile, the backing plate having at least one heating channel;
at least one elastomeric adhesive layer between the at least one sputtering target tile and the backing plate, wherein the at least one elastomeric adhesive layer bonds the at least one sputtering target and the backing plate together; and
at least one metal mesh within the at least one elastomeric adhesive layer, wherein at least a portion of the at least one metal mesh contacts both the at least one sputtering target tile and the backing plate, and the total surface area of the openings of the at least one metal mesh is between about 40% to about 70% of the total bonding surface area of the at least one sputtering target tile, wherein the elastomeric adhesive layer is cured by passing heated water through the at least one heating channel in the backing plate.

29. The sputtering target assembly of claim 28, wherein the heated water is at a temperature between 45° C. to about 70° C.

* * * * *

UNITED STATES PATENT AND TRADEMARK OFFICE
CERTIFICATE OF CORRECTION

PATENT NO. : 7,550,055 B2  Page 1 of 1
APPLICATION NO. : 11/224221
DATED : June 23, 2009
INVENTOR(S) : Le et al.

It is certified that error appears in the above-identified patent and that said Letters Patent is hereby corrected as shown below:

Column 8, Line 30, please delete "8301" and insert --830l-- therefor.

Signed and Sealed this

Eighth Day of September, 2009

David J. Kappos
*Director of the United States Patent and Trademark Office*